(12) United States Patent
Ogata et al.

(10) Patent No.: US 9,678,427 B2
(45) Date of Patent: Jun. 13, 2017

(54) RESIST UNDERLAYER FILM-FORMING COMPOSITION CONTAINING COPOLYMER THAT HAS TRIAZINE RING AND SULFUR ATOM IN MAIN CHAIN

(71) Applicant: NISSAN CHEMICAL INDUSTRIES, LTD., Tokyo (JP)

(72) Inventors: Hiroto Ogata, Toyama (JP); Takahiro Kishioka, Toyama (JP); Yoshiomi Hiroi, Toyama (JP); Tomoya Ohashi, Toyama (JP); Yuki Usui, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/106,861

(22) PCT Filed: Dec. 10, 2014

(86) PCT No.: PCT/JP2014/082705
§ 371 (c)(1),
(2) Date: Jun. 21, 2016

(87) PCT Pub. No.: WO2015/098525
PCT Pub. Date: Jul. 2, 2015

(65) Prior Publication Data
US 2017/0038687 A1    Feb. 9, 2017

(30) Foreign Application Priority Data

Dec. 27, 2013   (JP) ................................ 2013-271225

(51) Int. Cl.
*G03F 7/11*    (2006.01)
*G03F 7/09*    (2006.01)
(Continued)

(52) U.S. Cl.
CPC ............ *G03F 7/11* (2013.01); *C09D 167/025* (2013.01); *C09D 181/04* (2013.01); *G03F 7/094* (2013.01)

(58) Field of Classification Search
CPC ......................................................... G03F 7/11
(Continued)

(56) References Cited

U.S. PATENT DOCUMENTS

2004/0072420 A1    4/2004   Enomoto et al.
2010/0009297 A1    1/2010   Yao et al.

FOREIGN PATENT DOCUMENTS

JP   2004-126161 A   4/2004
JP   2006-503331 A   1/2006
(Continued)

OTHER PUBLICATIONS

Mar. 10, 2015 Search Report issued in International Patent Application No. PCT/JP2014/082705.
(Continued)

*Primary Examiner* — Duc Truong
(74) *Attorney, Agent, or Firm* — Oliff PLC

(57) ABSTRACT

A resist underlayer film-forming composition containing a copolymer having a structural unit of Formula (1) and a structural unit of Formula (2), a cross-linkable compound, a cross-linking catalyst, and a solvent.

(1)

$$\left[ X^1 - A - X^1 - \overset{}{\underset{OH}{\text{CH}_2}} - O - \overset{O}{\underset{}{\text{C}}} - Q - \overset{O}{\underset{}{\text{C}}} - O - \overset{}{\underset{OH}{\text{CH}_2}} \right]_n$$

(Continued)

-continued

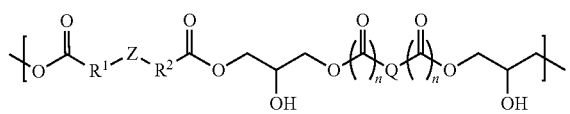
(2)

wherein A is a divalent organic group containing a triazine ring, $X^1$ is an —S— group or an —O— group, Q is a linear, branched, or cyclic hydrocarbon group having a carbon atom number of 1 to 15, the hydrocarbon group may have at least one sulfur atom or oxygen atom in a main chain and at least one hydroxy group as a substituent, n is 0 or 1, $R^1$ and $R^2$ are each independently a $C_{1-3}$ alkylene group or a single bond, Z is a divalent group having at least one sulfur atom or oxygen atom, and when $X^1$ is an —O— group, Z is a divalent group having at least one sulfur atom.

6 Claims, 2 Drawing Sheets

(51) Int. Cl.
  *C09D 167/02* (2006.01)
  *C09D 181/04* (2006.01)
  *C09D 167/00* (2006.01)
  *H01L 21/027* (2006.01)

(58) Field of Classification Search
  USPC ................................. 524/538; 525/330.9
  See application file for complete search history.

(56) References Cited

FOREIGN PATENT DOCUMENTS

| | | |
|---|---|---|
| JP | 2011-527461 A | 10/2011 |
| WO | 2004/036311 A2 | 4/2004 |
| WO | 2005/088398 A1 | 9/2005 |
| WO | 2006/040918 A1 | 4/2006 |
| WO | 2008/117867 A1 | 10/2008 |
| WO | 2009/096340 A1 | 8/2009 |
| WO | 2010/004378 A1 | 1/2010 |
| WO | 2013/118879 A1 | 8/2013 |
| WO | 2014/192716 A1 | 12/2014 |

OTHER PUBLICATIONS

Mar. 10, 2015 Written Opinion issued in International Patent Application No. PCT/JP2014/082705.

RESIST UNDERLAYER FILM-FORMING COMPOSITION CONTAINING COPOLYMER THAT HAS TRIAZINE RING AND SULFUR ATOM IN MAIN CHAIN

TECHNICAL FIELD

The present invention relates to a composition for forming a resist underlayer film that has a high dry etching rate, functions as an anti-reflective coating during exposure, and allows a concave part of a semiconductor substrate to be embedded.

BACKGROUND ART

For example, the formation of a fine resist pattern on a substrate by a photolithography technique including an exposure step using a KrF excimer laser or an ArF excimer laser as a light source has been known in the manufacture of a semiconductor element. A KrF excimer laser or an ArF excimer laser (incident light) incident to a resist film before the formation of a resist pattern is reflected on a surface of a substrate to generate a standing wave in the resist film. This standing wave has been known to prevent the formation of a resist pattern having a desired shape. In order to suppress the generation of the standing wave, the formation of an anti-reflective coating that absorbs incident light between the resist film and the substrate has been also known. When this anti-reflective coating is provided under the resist film, the anti-reflective coating is required to have a higher dry etching rate than that of the resist film.

Patent Documents 1 to 3 described below describe a resist underlayer film-forming composition or an anti-reflective coating-forming composition that contain a polymer having at least one sulfur atom in a structural unit. When the composition described in each of Patent Documents is used, a resist underlayer film or an anti-reflective coating that has a higher dry etching rate than that of the resist film can be obtained. When a substrate having a concave part on a surface is used in the manufacture of a semiconductor element, a gap-filling material or a planarizing film that allows the concave part of the substrate to be embedded is required. However, all Patent Documents 1 to 3 do not describe or suggest concave part-embedding properties. Further, a reaction of a polymer containing a triazine compound having two thiol groups that is described in Patent Document 2 with a compound having two epoxy groups is unlikely to be controlled during synthesis, and an odor derived from the thiol groups is generated. Therefore, the polymer has a problem in terms of handling.

PRIOR ART DOCUMENTS

Patent Documents

Patent Document 1: International Publication WO 2005/088398
Patent Document 2: International Publication WO 2006/040918
Patent Document 3: International Publication WO 2009/096340

SUMMARY OF THE INVENTION

Problem to be Solved by the Invention

A resist underlayer film is required to satisfy all requirements in which the film has a high dry etching rate, functions as an anti-reflective coating during exposure, and allows a concave part of a semiconductor substrate to be embedded in the manufacture of a semiconductor element. However, it is difficult that a conventional resist underlayer film or anti-reflective coating satisfies all the requirements.

Means for Solving the Problems

In order to solve the above-described problems, the present invention provides a resist underlayer film-forming composition containing specific copolymer, cross-linkable compound, cross-linking catalyst, and solvent. Specifically, the present invention is a resist underlayer film-forming composition containing a copolymer having a structural unit of Formula (1) and a structural unit of Formula (2), a cross-linkable compound, a cross-linking catalyst, and a solvent.

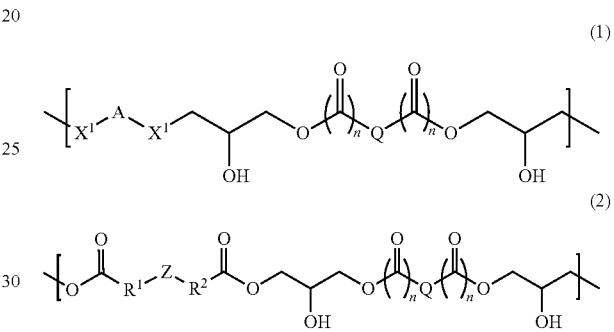

(in Formulae, A is a divalent organic group containing a triazine ring, $X^1$ is an —S— group or an —O— group, Q is a linear, branched, or cyclic hydrocarbon group having a carbon atom number of 1 to 15, the hydrocarbon group may have at least one sulfur atom or oxygen atom in a main chain and at least one hydroxy group as a substituent, n is 0 or 1, $R^1$ and $R^2$ are each independently a $C_{1-3}$ alkylene group or a single bond, Z is a divalent group having at least one sulfur atom or oxygen atom, and when $X^1$ is an —O— group, Z is a divalent group having at least one sulfur atom.)

For example, the hydrocarbon group contains a linear or branched alkylene group, a cycloalkylene group, or a phenylene group. A case where $R^1$ and $R^2$ are each independently a single bond means that the divalent group of Z and a carbon atom in a —C(═O)— group are bonded by the single bond.

In addition to the copolymer, the resist underlayer film-forming composition of the present invention further contains a copolymer having the structural unit of Formula (2) and no structural unit of Formula (1).

In Formula (1), A is, for example, an organic group of Formula (3):

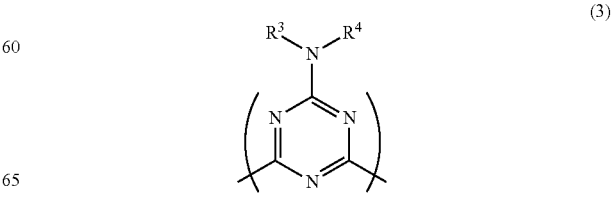

(In Formula, $R^3$ and $R^4$ are each independently a $C_{1-8}$ alkyl group or hydroxyalkyl group, a phenyl group, or a hydrogen atom.)

In Formula (2), Z is a disulfide group or a group of Formula (4):

(4)

(In Formula, $X^2$ is an —S— group or an —O— group, $R^5$ is a thiocarbonyl group or a $C_{1-3}$ alkylene group, and m is 0 or 1.)

The disulfide group is a divalent group in which two sulfur atoms are bonded to each other, which is represented by "—S—S—." The thiocarbonyl group is a divalent group in which an oxygen atom of a carbonyl group is substituted by a sulfur atom, which is represented by "—C(=S)—."

Effects of the Invention

The resist underlayer film-forming composition of the present invention is used to obtain a resist underlayer film that has a dry etching rate far higher than that of a resist film because of the presence of a sulfur atom in a main chain of a copolymer contained in the composition, functions as an anti-reflective coating during exposure without a decrease in the dry etching rate because of the presence of a triazine ring in the copolymer, and allows a concave part of a semiconductor substrate to be embedded.

MODES FOR CARRYING OUT THE INVENTION

Figure 1:
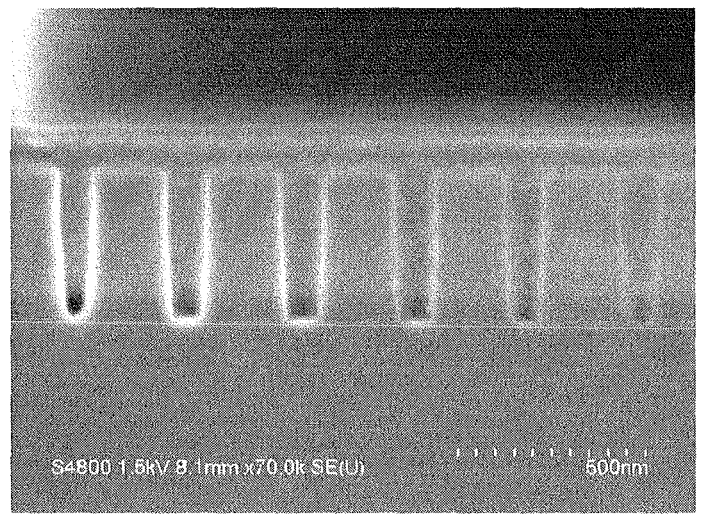
FIG. 1 is a cross-sectional SEM image of a $SiO_2$ wafer in which a hole is filled with a resist underlayer film formed of a resist underlayer film-forming composition of Example 1.
Figure 2:
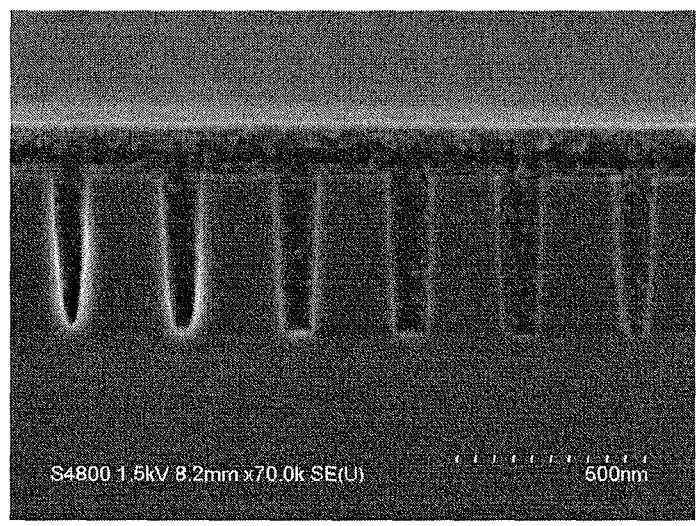
FIG. 2 is a cross-sectional SEM image of a $SiO_2$ wafer in which a hole is filled with a resist underlayer film formed of a resist underlayer film-forming composition of Example 2.
Figure 3:
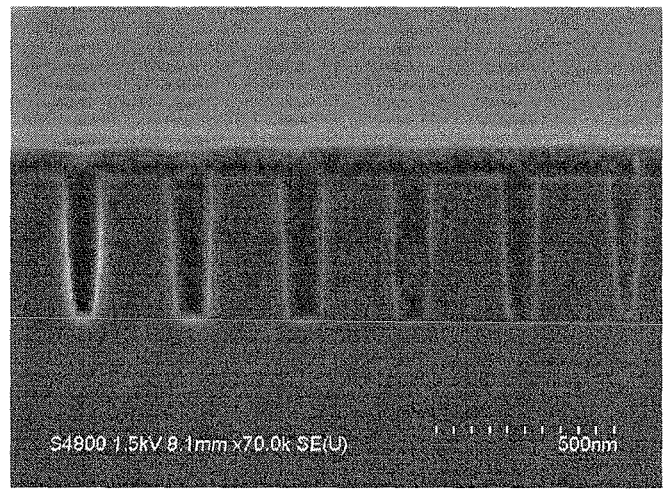
FIG. 3 is a cross-sectional SEM image of a $SiO_2$ wafer in which a hole is filled with a resist underlayer film formed of a resist underlayer film-forming composition of Example 3.
Figure 4:
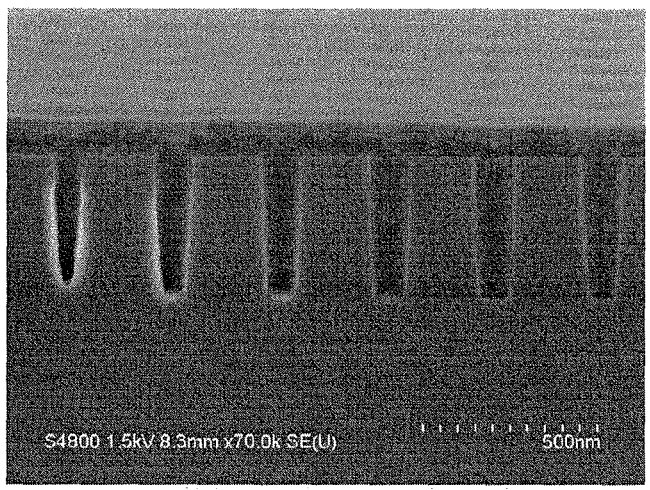
FIG. 4 is a cross-sectional SEM image of a $SiO_2$ wafer in which a hole is filled with a resist underlayer film formed of a resist underlayer film-forming composition of Example 4.

A copolymer constituting the resist underlayer film-forming composition of the present invention is synthesized by reacting a thiol group of a dithiol compound having a triazine ring with an epoxy group of a diglycidyl ether compound (or diglycidyl ester compound), and further reacting an epoxy group of the diglycidyl ether compound (or diglycidyl ester compound) with a carboxyl group of a dicarboxylic acid compound. When the dicarboxylic acid compound is thus used with the dithiol compound having a triazine ring, reaction control during the synthesis is easier than a case where the dicarboxylic acid compound is not used.

An epoxy group tends to preferentially react with a thiol group rather than a carboxyl group. Therefore, the dithiol compound having a triazine ring is consumed by a reaction earlier than the dicarboxylic acid compound. It is considered that only a reaction of the epoxy group of the diglycidyl ether compound (or diglycidyl ester compound) with the carboxyl group of the dicarboxylic acid compound proceeds at a latter period of the reaction.

Instead of the dithiol compound having a triazine ring, a diol compound having a triazine ring may be used. As the dicarboxylic acid compound, a dicarboxylic acid compound having at least one sulfur atom in a molecule or a dicarboxylic acid compound having at least one oxygen atom in a molecule may be used. Here, one of the dithiol compound having a triazine ring and the dicarboxylic acid compound having at least one sulfur atom in the molecule must be used. A sulfur atom and an oxygen atom are the same family elements (16 group elements) in a periodic table, as is well known.

Specific examples of the dithiol compound having a triazine ring are Formulae (3a) to (3g):

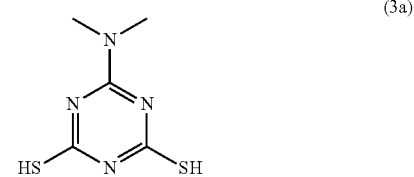

(3a)

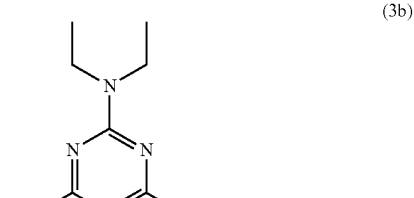

(3b)

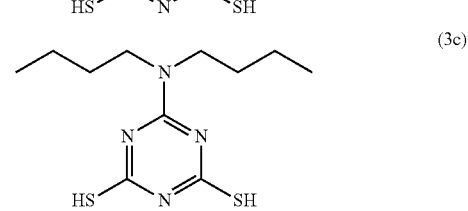

(3c)

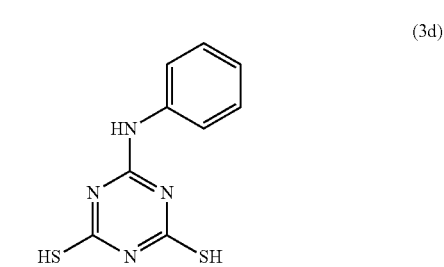

(3d)

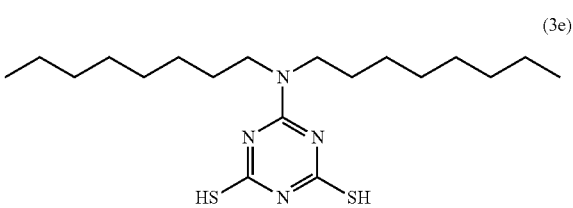

(3e)

(3f)
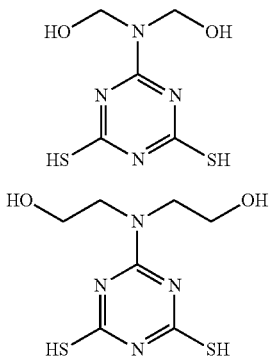
(3g)
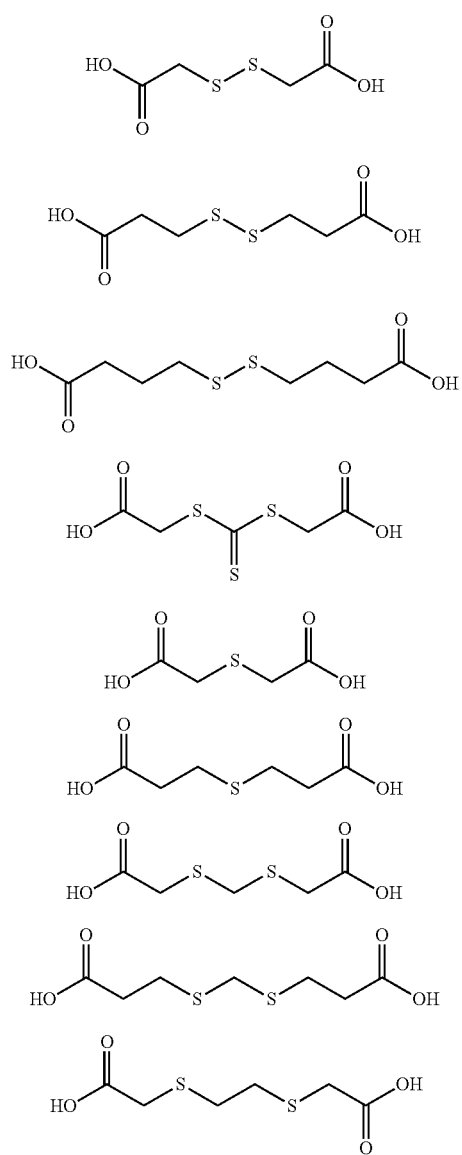
Specific examples of the dicarboxylic acid compound having at least one sulfur atom or oxygen atom in the molecule are Formulae (4a) to (4n):
(4a)–(4i)
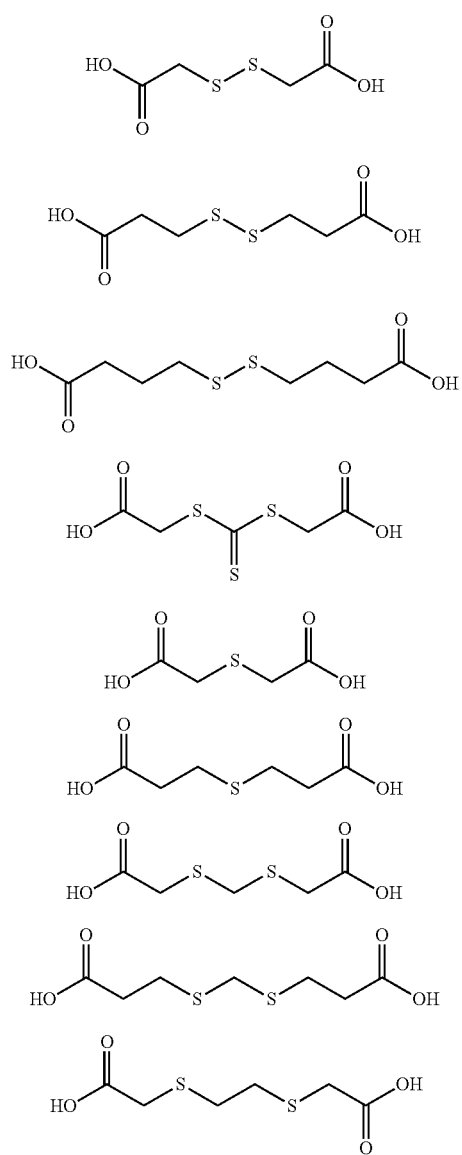
(4j)
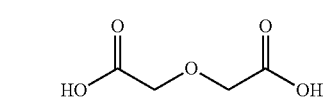
(4k)
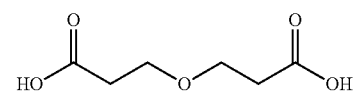
(4l)
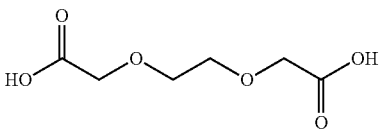
(4m)
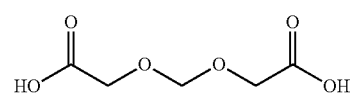
(4n)
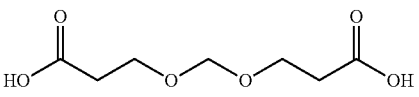
Specific examples of the diglycidyl ether compound and the diglycidyl ester compound are Formulae (5a) to (5r):
(5a)
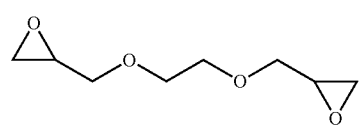
(5b)
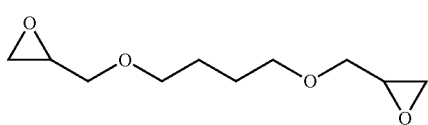
(5c)
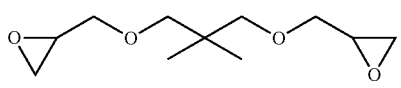
(5d)
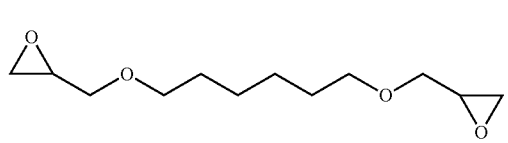
(5e)
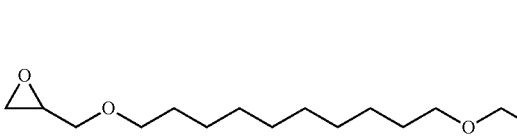
(5f)

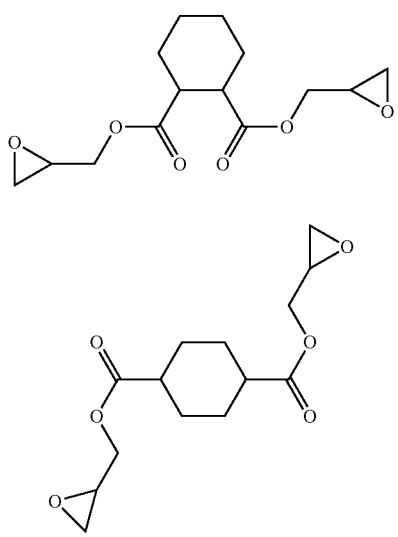
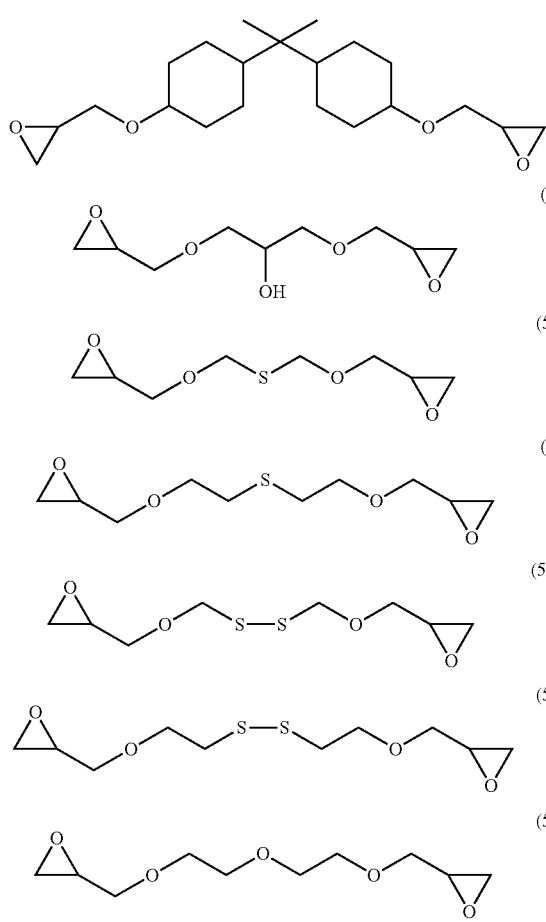
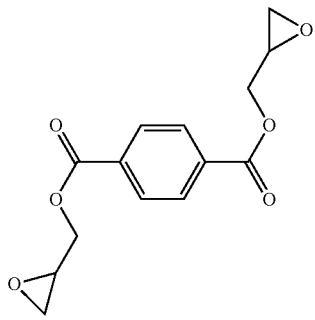
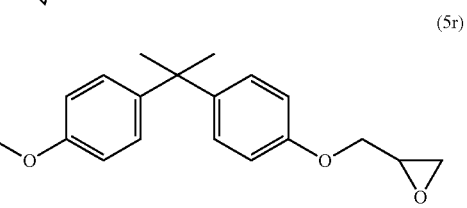

For example, the copolymer has a weight average molecular weight of 1,000 to 100,000, and preferably 1,000 to 30,000. When the weight average molecular weight of the copolymer is less than 1,000, the resistance to a solvent may be insufficient. The weight average molecular weight is a value obtained by gel permeation chromatography (hereinafter abbreviated as GPC in the specification) using polystyrene as a standard sample.

The resist underlayer film-forming composition of the present invention contains a cross-linkable compound. The cross-linkable compound is also called cross-linker. As the cross-linkable compound, a compound having at least two cross-linking-forming substituents is preferably used. Examples thereof include a melamine-based compound, a substituted urea-based compound, or an aromatic compound that has at least two cross-linking-forming substituents such as a hydroxymethyl group and an alkoxymethyl group, a compound having at least two epoxy groups, and a compound having at least two blocked isocyanate groups. Examples of the alkoxymethyl group include a methoxymethyl group, a 2-methoxyethoxymethyl group, and a butoxymethyl group. As the cross-linkable compound, a nitrogen-containing compound having at least two, for example, two to four nitrogen atoms bonded to a hydroxymethyl group or an alkoxymethyl group is more preferably used. Examples of the nitrogen-containing compound include hexamethoxy methyl melamine, tetramethoxymethyl benzoguanamine, 1,3,4,6-tetrakis(methoxymethyl) glycoluril, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea.

Examples of the aromatic compound having at least two hydroxymethyl groups or alkoxymethyl groups include 1-hydroxybenzene-2,4,6-trimethanol, 3,3',5,5'-tetrakis(hydroxymethyl)-4,4'-dihydroxybiphenyl (trade name: TML-BP, available from Honshu Chemical Industry Co., Ltd.), 5,5'-[2,2,2-trifluoro-1-(trifluoromethyl)ethylidene]bis[2-hydroxy-1,3-benzenedimethanol] (trade name: TML-BPAF-MF, available from Honshu Chemical Industry Co., Ltd.), 2,2-dimethoxymethyl-4-tert-butylphenol (trade name: DMOM-PTBP, available from Honshu Chemical Industry Co., Ltd.), 3,3',5,5'-tetramethoxymethyl-4,4'-dihydroxybiphenyl (trade name: TMOM-BP, available from Honshu Chemical Industry Co., Ltd.), bis(2-hydroxy-3-hydroxymethyl-5-methylphenyl)methane (trade name: DM-BIPC-F, available from Asahi Organic Chemicals Industry Co., Ltd.), bis(4-hydroxy-3-hydroxymethyl-5-methylphenyl)methane (trade name: DM-BIOC-F, available from Asahi Organic Chemicals Industry Co., Ltd.), and 5,5'-(1-methylethylidene)bis(2-hydroxy-1,3-benzenedimethanol) (trade name: TM-BIP-A, available from Asahi Organic Chemicals Industry Co., Ltd.).

Examples of the compound having at least two epoxy groups include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidyl aniline), 3,4-epoxycyclohexylmethyl-3,4-epoxycyclohexane carboxylate, trimethylol ethane triglycidyl ether, bisphenol-A-diglycidyl ether, EPOLEAD (registered trademark) GT-401, EPOLEAD GT-403, EPOLEAD GT-301, and EPOLEAD GT-302, and CELLOXIDE (registered trademark) 2021 and CELLOXIDE 3000 available from Daicel Corporation, 1001, 1002, 1003, 1004, 1007, 1009, 1010, 828, 807, 152, 154, 180S75, 871, and 872 available from Mitsubishi Chemical Corporation, EPPN201, and EPPN 202, and EOCN-102, EOCN-103S, EOCN-104S, EOCN-1020, EOCN-1025, and EOCN-1027 available from NIPPON KAYAKU Co., Ltd., Denacol (registered trademark) EX-252, Denacol EX-611, Denacol EX-612, Denacol EX-614, Denacol EX-622, Denacol EX-411, Denacol EX-512, Denacol EX-522, Denacol EX-421, Denacol EX-313, Denacol EX-314, and Denacol EX-321 available from Nagase ChemteX Corporation, CY175, CY177, CY179, CY182, CY184, and CY192 available from BASF Japan Ltd., and EPICLON 200, EPICLON 400, EPICLON 7015, EPICLON 835LV, and EPICLON 850CRP available from DIC Corporation.

As the compound having at least two epoxy groups, a polymer compound may be used. The polymer compound can be used without particular limitation as long as it is a polymer having at least two epoxy groups. The polymer compound can be produced by addition polymerization using an addition-polymerizable monomer having an epoxy group or by a reaction of a polymer having a hydroxy group with a compound having an epoxy group such as epichlorohydrin and glycidyl tosylate. Examples of the polymer having at least two epoxy groups include addition polymerization polymers such as polyglycidyl acrylate, a copolymer of glycidyl methacrylate with ethyl methacrylate, and a copolymer of glycidyl methacrylate, styrene, and 2-hydroxyethyl methacrylate, and condensation polymerization polymers such as epoxy novolac. The polymer compound has a weight average molecular weight of 300 to 200,000. The weight average molecular weight is a value obtained by GPC using polystyrene as a standard sample.

As the compound having at least two epoxy groups, an epoxy resin having an amino group may be further used. Examples of the epoxy resin include YH-434 and YH-434L (available from NSCC Epoxy Manufacturing Co., Ltd.).

Examples of the compound having at least two blocked isocyanate groups include TAKENATE (registered trademark) B-830 and TAKENATE B-870N available from Mitsui Chemicals, Inc., and VESTANAT (registered trademark) -B1358/100 available from Evonik Degussa GmbH.

These compounds may be used singly or two or more of them may be used in combination.

The content of the cross-linkable compound is, for example, 1% by mass to 80% by mass, and preferably 10% by mass to 60% by mass, relative to the content of the copolymer. When the content of the cross-linkable compound is too small or too large, the resistance of a film to be formed to a resist solvent may be insufficiently achieved.

In order to promote a cross-linking reaction, the resist underlayer film-forming composition of the present invention contains a cross-linking catalyst in addition to the cross-linkable compound. As the cross-linking catalyst, a sulfonic acid compound or a carboxylic acid compound, or a thermal acid generator may be used. Examples of the sulfonic acid compound include p-toluenesulfonic acid, pyridinium p-toluenesulfonate, 5-sulfosalicylic acid, 4-chlorobenzenesulfonic acid, 4-hydroxybenzenesulfonic acid, pyridinium-4-hydroxybenzene sulfonate, n-dodecyl benzenesulfonic acid, 4-nitrobenzenesulfonic acid, benzenedisulfonic acid, 1-naphthalenesulfonic acid, trifluoromethanesulfonic acid, and camphorsulfonic acid. Examples of the carboxylic acid compound include salicylic acid, citric acid, benzoic acid, and hydroxybenzoic acid. Examples of the thermal acid generator include K-PURE (registered trademark) CXC-1612, K-PURE CXC-1614, K-PURE TAG-2172, K-PURE TAG-2179, K-PURE TAG-2678, and K-PURE TAG2689 (available from King Industries, Inc.), and SI-45, SI-60, SI-80, SI-100, SI-110, and SI-150 (available from SANSHIN CHEMICAL INDUSTRY CO., LTD.).

These cross-linking catalysts may be used singly or two or more of them may be used in combination. The content of the cross-linking catalyst is, for example, 1% by mass to 40% by mass, and preferably 5% by mass to 20% by mass, relative to the content of the cross-linkable compound.

The resist underlayer film-forming composition of the present invention may contain a surfactant as an optional component to improve coating properties to a substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitane tristearate, fluorosurfactants including Eftop (registered trademark) EF301, Eftop EF303, and Eftop EF352 (available from Mitsubishi Materials Electronic Chemicals Co., Ltd.), MEGAFACE (registered trademark) F171, MEGAFACE F173, MEGAFACE R-30, MEGAFACE R-30N, and MEGAFACE R-40-LM (available from DIC Corporation), Fluorad FC430 and Fluorad FC431 (available from Sumitomo 3M, Ltd.), and Asahi Guard (registered trademark) AG710, and Surflon (registered trademark) S-382, Surflon SC101, Surflon SC102, Surflon SC103, Surflon SC104, Surflon SC105, and Surflon SC106 (available from Asahi Glass Co., Ltd.), and organosiloxane polymer KP341 (available from Shin-Etsu Chemical Co., Ltd.). These surfactants may be added singly or two or more of them may be added in combination.

When the surfactant is used, the content of the surfactant is, for example, 0.01% by mass to 5% by mass, and preferably 0.1% by mass to 3% by mass, relative to the content of the copolymer.

The resist underlayer film-forming composition of the present invention can be prepared by dissolving the components in an appropriate solvent. The resist underlayer film-forming composition can be used in a homogeneous solution state. Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethyl formamide, N,N-dimethyl acetamide, or N-methyl-2-pyrrolidone may be used. These solvents may be used singly or two or more of them may be used in combination. Further, a mixture obtained by a solvent having a high boiling point such as propylene glycol monobutyl ether and propylene glycol monobutyl ether acetate in the solvent may be also used.

It is preferable that the prepared composition be used after filtration through a filter having a pore size of 0.05 µm, for example. The resist underlayer film-forming composition of the present invention has excellent storage stability at room temperature for a long period.

Hereinafter, the use of the resist underlayer film-forming composition of the present invention will be described. The composition of the present invention is applied to a substrate having a concave part (e.g., a semiconductor substrate such as a silicon wafer and a germanium wafer that may be coated with a silicon oxide film, a silicon nitride film, or a silicon nitride oxide film) by an appropriate coating method such as a spinner and a coater. The composition is then baked by a heating means such as a hot plate to form a resist underlayer film. A baking condition is appropriately selected from a baking temperature of 80° C. to 250° C. and a baking time of 0.3 minutes to 10 minutes. It is preferable that the baking temperature be 120° C. to 250° C. and the baking time be 0.5 minutes to 5 minutes. The resist underlayer film has a film thickness of 0.005 µm to 3.0 µm, for example, 0.01 µm to 0.1 µm or 0.05 µm to 0.5 µm.

When the temperature during baking is lower than the above-described range, cross-linking is insufficient, and intermixing between the resist underlayer film and a resist film to be formed as an upper layer may occur. When the temperature during baking is higher than the above-described range, intermixing between the resist underlayer film and the resist film may occur due to cutting of cross-linking.

Subsequently, the resist film is formed on the resist underlayer film. The resist film can be formed by a general method, that is, by applying a photoresist solution to the resist underlayer film, followed by baking.

The photoresist solution used to form the resist film is not particularly limited as long as it can be sensitive to a light source used in exposure, and a negative photoresist solution or a positive photoresist solution may be used.

In order to form a resist pattern, exposure through a mask (reticle) for forming a predetermined pattern is performed. For example, a KrF excimer laser or an ArF excimer laser can be used for the exposure. After the exposure, post exposure bake is performed, if necessary. A "post exposure bake" condition is appropriately selected from a heating temperature of 80° C. to 150° C. and a heating time of 0.3 minutes to 10 minutes. After then, the resist pattern is formed through a step of development with an alkaline developer.

Examples of the alkaline developer include alkaline aqueous solutions including an aqueous solution of an alkali metal hydroxide such as potassium hydroxide and sodium hydroxide, an aqueous solution of quaternary ammonium hydroxide such as tetramethylammonium hydroxide, tetraethylammonium hydroxide, and choline, and an aqueous solution of amine such as ethanolamine, propylamine, and ethylenediamine. Further, a surfactant or the like may be added to the developer. A development condition is appropriately selected from a development temperature of 5° C. to 50° C. and a development time of 10 seconds to 300 seconds.

EXAMPLES

Hereinafter, specific examples of the resist underlayer film-forming composition of the present invention will be described with reference to the following Examples. However, the present invention is not limited to these Examples.

A device and the like used in the measurement of weight average molecular weights of reaction products obtained in the following Synthesis Examples are shown.

Device: HLC-8320GPC manufactured by TOSOH CORPORATION
GPC column: Asahipak (registered trademark) GF-310HQ, Asahipak GF-510HQ, and Asahipak GF-710HQ
Column temperature: 40° C.
Flow rate: 0.6 mL/min
Eluent: DMF
Standard sample: polystyrene Synthesis Example 1

To 84.55 g of propylene glycol monomethyl ether (hereinafter abbreviated as PGME in the specification), 3.40 g of 2-dibutylamino-4,6-dithiol-1,3,5-triazine, 7.34 g of 1,4-butanediol diglycidyl ether, 6.82 g of 3,3'-dithiodipropionic acid, and 0.93 g of ethyltriphenylphosphonium bromide as a catalyst were added, and the mixture was reacted at 100° C. for 24 hours to obtain a solution containing the reaction product. The obtained reaction product was analyzed by GPC. The weight average molecular weight in terms of standard polystyrene was 5,200. The resulting reaction product is presumed to contain a copolymer having a structural unit of Formula (1a) and a structural unit of Formula (2a) and a copolymer having the structural unit of Formula (2a) and no structural unit of Formula (1a).

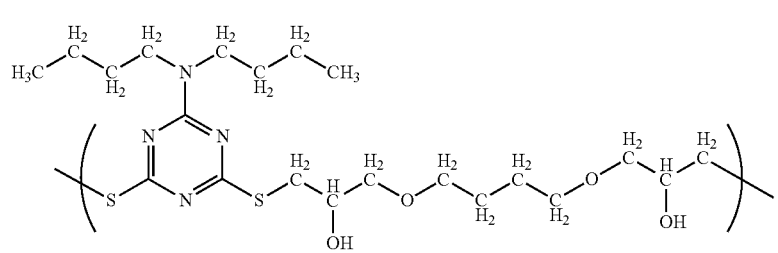

(1a)

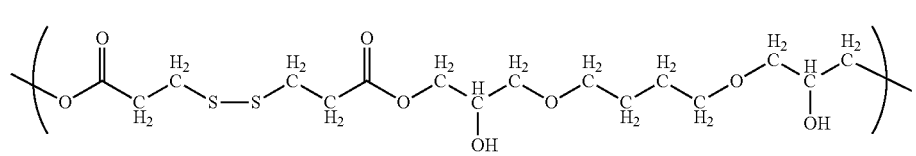

(2a)

Synthesis Example 2

To 75.31 g of PGME, 4.90 g of 2-dibutylamino-4,6-dithiol-1,3,5-triazine, 9.00 g of 1,4-butanediol diglycidyl ether, 4.10 g of dithiodiglycolic acid, and 0.83 g of ethyltriphenylphosphonium bromide as a catalyst were added, and the mixture was reacted at 100° C. for 24 hours to obtain a solution containing the reaction product. The obtained reaction product was analyzed by GPC. The weight average molecular weight in terms of standard polystyrene was 4,500. The resulting reaction product is presumed to contain a copolymer having a structural unit of Formula (1b) and a structural unit of Formula (2b) and a copolymer having the structural unit of Formula (2b) and no structural unit of Formula (1b).

Synthesis Example 3

To 72.13 g of PGME, 2.67 g of 2-dibutylamino-4,6-dithiol-1,3,5-triazine, 10.00 g of 1,4-ethanediol diglycidyl ether, 4.64 g of dithiodiglycolic acid, and 0.73 g of ethyltriphenylphosphonium bromide as a catalyst were added, and the mixture was reacted at 100° C. for 24 hours to obtain a solution containing the reaction product. The obtained reaction product was analyzed by GPC. The weight average molecular weight in terms of standard polystyrene was 1,700. The resulting reaction product is presumed to contain a copolymer having a structural unit of Formula (1c) and a structural unit of Formula (2c) and a copolymer having the structural unit of Formula (2c) and no structural unit of Formula (1c).

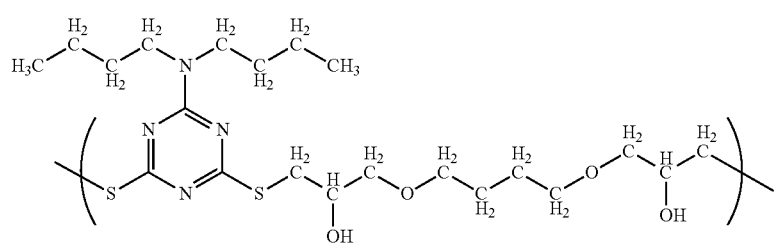

(1b)

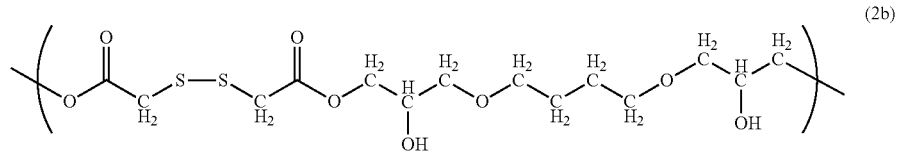

(2b)

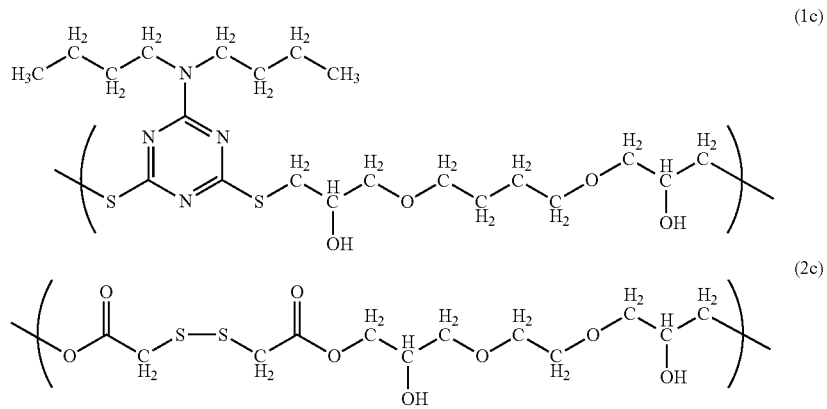

(1c)

(2c)

Synthesis Example 4

To 86.65 g of PGME, 3.40 g of 2-dibutylamino-4,6-dithiol-1,3,5-triazine, 10.00 g of 1,4-butanediol diglycidyl ether, 7.34 g of bis(carboxymethyl) trithiocarbonate, and 0.93 g of ethyltriphenylphosphonium bromide as a catalyst were added, and the mixture was reacted at 100° C. for 24 hours to obtain a solution containing the reaction product. The obtained reaction product was analyzed by GPC. The weight average molecular weight in terms of standard polystyrene was 2,500. The resulting reaction product is presumed to contain a copolymer having a structural unit of Formula (1d) and a structural unit of Formula (2d) and a copolymer having the structural unit of Formula (2d) and no structural unit of Formula (1d).

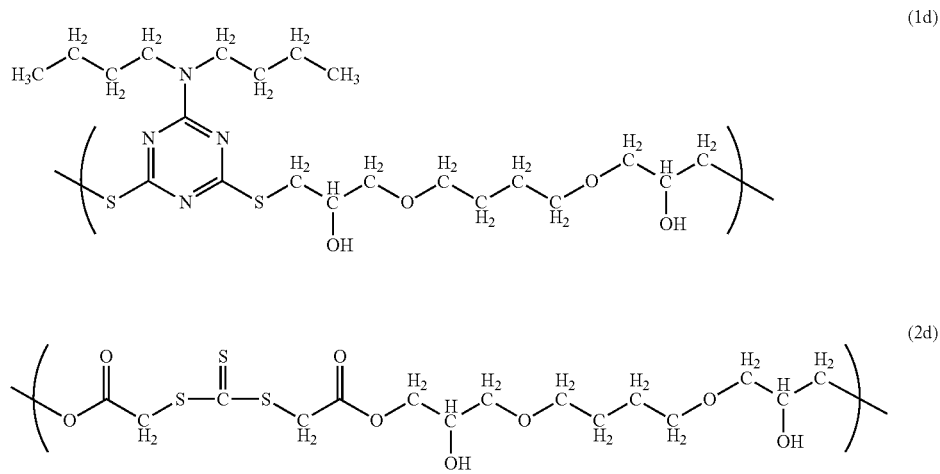

(1d)

(2d)

Synthesis Example 5

To 84.55 g of PGME, 10.00 g of 1,4-butanediol diglycidyl ether, 9.44 g of 3,3'-dithiodipropionic acid, and 0.93 g of ethyltriphenylphosphonium bromide as a catalyst were added, and the mixture was reacted at 100° C. for 24 hours to obtain a solution containing the reaction product. The obtained reaction product was analyzed by GPC. The weight average molecular weight in terms of standard polystyrene was 5,800. The resulting reaction product is presumed to be a copolymer having a structural unit of Formula (2a).

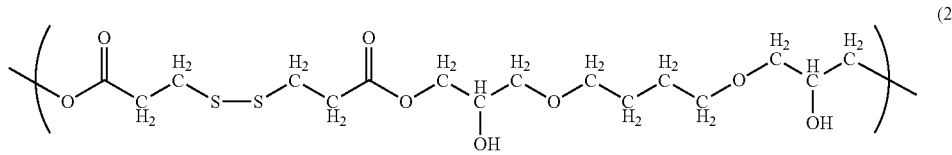

(2a)

Synthesis Example 6

To 93.50 g of PGME, 12.91 g of 2-dibutylamino-4,6-dithiol-1,3,5-triazine, 10.00 g of 1,4-butanediol diglycidyl ether, and 0.46 g of ethyltriphenylphosphonium bromide as a catalyst were added, and the mixture was reacted under reflux for 12 hours to obtain a solution containing the reaction product. The obtained reaction product was analyzed by GPC. The weight average molecular weight in terms of standard polystyrene was 20,000. The resulting reaction product is presumed to be a copolymer having a structural unit of Formula (1a).

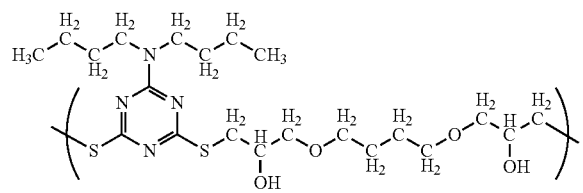

(1a)

[Preparation of Resist Underlayer Film-Forming Composition]

Example 1

In 53.01 g of the solution containing 7.82 g of the copolymer obtained in Synthesis Example 1 (a solvent was PGME used during synthesis), 52.46 g of PGME, 41.85 g of propylene glycol monomethyl ether acetate, 2.35 g of tetramethoxymethyl glycoluril (trade name: POWDERLINK 1174 available from Nihon Cytec Industries Inc.), 0.31 g of pyridinium p-toluenesulfonate, and 0.0078 g of surfactant (trade name: R-30N available from DIC Corporation) were mixed to obtain a 6.9% by mass solution. The solution was filtered through a microfilter made of polytetrafluoroethylene having a pore size of 0.2 μm to prepare a resist underlayer film-forming composition.

Example 2

In 3.21 g of the solution containing 0.48 g of the copolymer obtained in Synthesis Example 2 (a solvent was PGME used during synthesis), 4.28 g of PGME, 2.79 g of propylene glycol monomethyl ether acetate, 0.16 g of tetramethoxymethyl glycoluril (trade name: POWDERLINK 1174 available from Nihon Cytec Industries Inc.), 0.021 g of pyridinium p-toluenesulfonate, and 0.00052 g of surfactant (trade name: R-30N available from DIC Corporation) were mixed to obtain a 7.0% by mass solution. The solution was filtered through a microfilter made of polytetrafluoroethylene having a pore size of 0.2 μm to prepare a resist underlayer film-forming composition.

Example 3

In 3.26 g of the solution containing 0.49 g of the copolymer obtained in Synthesis Example 3 (a solvent was PGME used during synthesis), 3.77 g of PGME, 2.81 g of propylene glycol monomethyl ether acetate, 0.15 g of tetramethoxymethyl glycoluril (trade name: POWDERLINK 1174 available from Nihon Cytec Industries Inc.), 0.019 g of pyridinium p-toluenesulfonate, and 0.00049 g of surfactant (trade name: R-30N available from DIC Corporation) were mixed to obtain a 6.5% by mass solution. The solution was filtered through a microfilter made of polytetrafluoroethylene having a pore size of 0.2 μm to prepare a resist underlayer film-forming composition.

Example 4

In 4.76 g of the solution containing 0.76 g of the copolymer obtained in Synthesis Example 4 (a solvent was PGME used during synthesis), 5.83 g of PGME, 4.19 g of propylene glycol monomethyl ether acetate, 0.20 g of tetramethoxymethyl glycoluril (trade name: POWDERLINK 1174 available from Nihon Cytec Industries Inc.), 0.020 g of pyridinium p-toluenesulfonate, and 0.00080 g of surfactant (trade name: R-30N available from DIC Corporation) were mixed to obtain a 6.8% by mass solution. The solution was filtered through a microfilter made of polytetrafluoroethylene having a pore size of 0.2 μm to prepare a resist underlayer film-forming composition.

Comparative Example 1

In 1.60 g of the solution containing 0.24 g of the copolymer obtained in Synthesis Example 5 (a solvent was PGME used during synthesis), 1.91 g of PGME, 1.40 g of propylene glycol monomethyl ether acetate, 0.074 g of tetramethoxymethyl glycoluril (trade name: POWDERLINK 1174 available from Nihon Cytec Industries Inc.), 0.0098 g of pyridinium p-toluenesulfonate, and 0.00025 g of surfactant (trade name: R-30N available from DIC Corporation) were mixed to obtain a 6.6% by mass solution. The solution was filtered through a microfilter made of polytetrafluoroethylene having a pore size of 0.2 μm to prepare a resist underlayer film-forming composition.

Comparative Example 2

In 9.47 g of the solution containing 1.58 g of the copolymer obtained in Synthesis Example 6 (a solvent was PGME used during synthesis), 11.70 g of PGME, 8.40 g of propylene glycol monomethyl ether acetate, 0.40 g of tetramethoxymethyl glycoluril (trade name: POWDERLINK 1174 available from Nihon Cytec Industries Inc.), 0.039 g of pyridinium p-toluenesulfonate, and 0.0016 g of surfactant (trade name: R-30N available from DIC Corporation) were mixed to obtain a 6.7% by mass solution. The solution was filtered through a microfilter made of polytetrafluoroethylene having a pore size of 0.2 μm to prepare a resist underlayer film-forming composition.

[Elution Test into Photoresist Solvent]

The resist underlayer film-forming composition prepared in each of Examples 1 to 4 was applied to a silicon wafer using a spinner. The wafer was baked on a hot plate at 205° C. for 1 minute to form a resist underlayer film (film thickness: 0.2 μm). The resist underlayer film was immersed in PGME and propylene glycol monomethyl ether acetate that were solvents used for a photoresist solution. It was confirmed that the resist underlayer films were insoluble in the solvents. The resist underlayer film was immersed in an alkaline developer for photoresist development (2.38% by mass tetramethylammonium hydroxide aqueous solution). It was confirmed that the resist underlayer films were insoluble in the developer.

[Test of Optical Parameter]

The resist underlayer film-forming composition prepared in each of Examples 1 to 4 and Comparative Examples 1 and 2 was applied to a silicon wafer using a spinner. The wafer was baked on a hot plate at 205° C. for 1 minute to form a resist underlayer film (film thickness: 0.2 μm). The refractive index (n value) and extinction coefficient (k value) of the resist underlayer film were measured at a wavelength of 248 nm using an optical ellipsometer (VUV-VASE VU-302 manufactured by J. A. Woollam Co.). The results are shown in Table 1. It is desirable that the resist underlayer film has a k value of 0.1 or more at a wavelength of 248 nm to have a sufficient anti-reflection function.

[Measurement of Dry Etching Rate]

A resist underlayer film was formed on a silicon wafer by the same method as described above using the resist underlayer film-forming composition in each of Examples 1 to 4 and Comparative Examples 1 and 2. The dry etching rates of the resist underlayer films were measured under a condition of using a RIE system manufactured by SAMCO INC., and using $N_2$ as a dry etching gas. A photoresist solution (trade name: V146G available from JSR Corporation) was applied to a silicon wafer using a spinner, and baked on a hot plate at 110° C. for 1 minute to form a photoresist film. The dry etching rate of the photoresist film was measured under a condition of using a RIE system manufactured by SAMCO INC., and using $N_2$ as a dry etching gas. The dry etching rate of each of the resist underlayer films was calculated relative to the dry etching rate of the photoresist film as 1.00. The results are shown as "selection ratio" in Table 1 described blow.

TABLE 1

|  | n value | k value | Selection ratio |
| --- | --- | --- | --- |
| Example 1 | 1.63 | 0.13 | 3.43 |
| Example 2 | 1.60 | 0.19 | 3.42 |
| Example 3 | 1.64 | 0.11 | 3.91 |
| Example 4 | 1.61 | 0.13 | 3.72 |
| Comparative Example 1 | 1.63 | 0.01 | 3.85 |
| Comparative Example 2 | 1.62 | 0.40 | 2.91 |

As seen from the results in Table 1, the resist underlayer film formed of the resist underlayer film-forming composition in Comparative Example 1 has a k value of 0.01, which is far smaller than 0.1, and hardly has an anti-reflection function. In contrast, the resist underlayer films formed of the resist underlayer film-forming compositions in Examples 1 to 4 and Comparative Example 2 have a k value more than 0.1, and have a sufficient anti-reflection function. In the resist underlayer film formed of the resist underlayer film-forming composition in Comparative Example 2, the "selection ratio" is the smallest among the results, and the dry etching rate is smaller than those of the resist underlayer films formed of the resist underlayer film-forming compositions in Examples 1 to 4 and Comparative Example 1.

[Test of Embedding Properties (Filling Properties)]

The resist underlayer film-forming composition in each of Examples 1 to 4 was applied to a silicon wafer having a plurality of holes (diameter: 0.12 μm, depth: 0.4 μm) and an $SiO_2$ film on a surface (manufactured by Advantec Co. Ltd., hereinafter abbreviated as $SiO_2$ wafer in the specification) using a spinner. The wafer was baked on a hot plate at 205° C. for 1 minute to form a resist underlayer film (film thickness: 0.2 μm). The cross-sectional shape of the $SiO_2$ wafer having the resist underlayer film formed by applying the resist underlayer film-forming composition in each of Examples 1 to 4 to the $SiO_2$ wafer followed by baking was observed by a scanning electron microscope (SEM). Thus, the embedding properties (filling properties) to the holes of the $SiO_2$ wafer with the resist underlayer film were evaluated. The results are shown in FIGS. 1 to 4. As seen in FIGS. 1 to 4, voids (gaps) inside the holes were not observed, the holes were filled with the resist underlayer film, and the entire holes were completely embedded.

Figure 5:
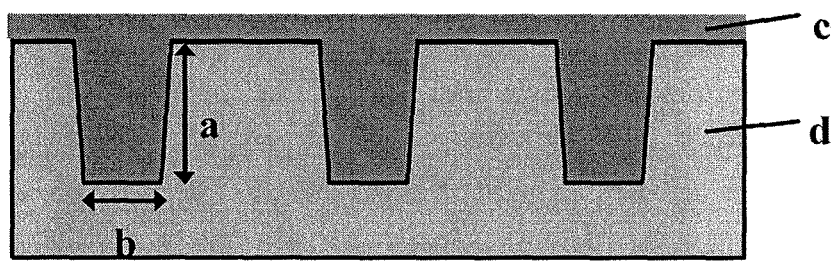
FIG. 5 is a schematic view showing a cross section of a $SiO_2$ wafer used in a test of hole-embedding properties (filling properties) of a resist underlayer film.

The $SiO_2$ wafer used had holes in a dense pattern, as shown in the schematic view of FIG. 5. The dense pattern is a pattern in which a distance between the center of each hole and the center of each adjacent hole is 1.5 times the diameter of the holes. The depth a of each hole of a $SiO_2$ wafer d in FIG. 5 is 0.4 μm, and the diameter b of each hole is 0.12 μm.

DESCRIPTION OF THE REFERENCE NUMERALS a: depth of each hole of $SiO_2$ wafer
b: diameter of each hole of $SiO_2$ wafer
c: resist underlayer film
d: $SiO_2$ wafer

The invention claimed is:

1. A resist underlayer film-forming composition containing a copolymer having a structural unit of Formula (1) and a structural unit of Formula (2), a cross-linkable compound, a cross-linking catalyst, and a solvent

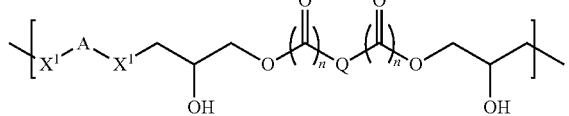

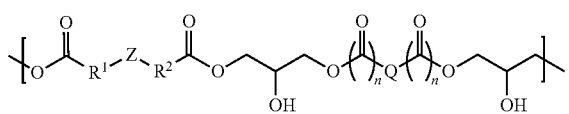

(in Formulae, A is a divalent organic group containing a triazine ring, $X^1$ is an —S— group or an —O— group, Q is a linear, branched, or cyclic hydrocarbon group having a carbon atom number of 1 to 15, the hydrocarbon group may have at least one sulfur atom or oxygen atom in a main chain and at least one hydroxy group as a substituent, n is 0 or 1, $R^1$ and $R^2$ are each independently a $C_{1-3}$ alkylene group or a single bond, Z is a divalent group having at least one sulfur atom or oxygen atom, and when $X^1$ is an —O— group, Z is a divalent group having at least one sulfur atom).

2. The resist underlayer film-forming composition according to claim 1, further containing a copolymer having the structural unit of Formula (2) and no structural unit of Formula (1).

3. The resist underlayer film-forming composition according to claim 1, wherein A in Formula (1) is an organic group of Formula (3):

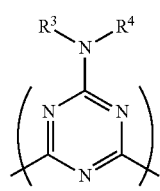

(In Formula, $R^3$ and $R^4$ are each independently a $C_{1-8}$ alkyl group or hydroxyalkyl group, a phenyl group, or a hydrogen atom).

4. The resist underlayer film-forming composition according to claim 1, wherein Z in Formula (2) is a disulphide group or a group of Formula (4):

(In Formula, $X^2$ is an —S— group or an —O— group, $R^5$ is a thiocarbonyl group or a $C_{1-3}$ alkylene group, and m is 0 or 1).

5. The resist underlayer film-forming composition according to claim 1, wherein the cross-linkable compound is a nitrogen-containing compound having at least two nitrogen atoms bonded to hydroxymethyl groups or alkoxymethyl groups, an aromatic compound having at least two hydroxymethyl groups or alkoxymethyl groups, a compound having at least two epoxy groups, or a compound having at least two blocked isocyanate groups.

6. The resist underlayer film-forming composition according to claim 1, further containing a surfactant.

* * * * *